United States Patent [19]

Carey

[11] 4,433,414
[45] Feb. 21, 1984

[54] DIGITAL TESTER LOCAL MEMORY DATA STORAGE SYSTEM

[75] Inventor: Maurice E. Carey, Troy, N.Y.

[73] Assignee: Fairchild Camera and Instrument Corporation, Mountain View, Calif.

[21] Appl. No.: 307,322

[22] Filed: Sep. 30, 1981

[51] Int. Cl.³ .................................................. G01R 31/28
[52] U.S. Cl. ................................................ 371/27; 371/25
[58] Field of Search ................................ 371/27, 25, 20

[56] References Cited

U.S. PATENT DOCUMENTS

| 3,222,653 | 12/1965 | Rice | 371/10 |
| 3,999,051 | 12/1976 | Petschauer | 371/10 |
| 4,066,880 | 1/1978 | Salley | 371/10 |
| 4,287,594 | 9/1981 | Shirasaka | 371/27 |
| 4,293,950 | 10/1981 | Shimizu et al. | 371/27 |

FOREIGN PATENT DOCUMENTS 52-47345  4/1977  Japan .................................. 371/27
55-47543  4/1980  Japan .................................. 371/27

Primary Examiner—Charles E. Atkinson
Attorney, Agent, or Firm—James A. LaBarre; Michael J. Pollock; Theodore Scott Park

[57] ABSTRACT

In a digital tester for evaluating electronic components, a local memory unit for each data channel in the tester is loaded with test vector information only in the locations of the memory relating to transitions that take place in the operation of the data channel. In addition, a transition bit is stored in each memory location to signify whether the vector information in that location represents valid transition data. The transition bit is used to control the reading of information from the memory into a register that controls the flow of information in the data channel, so that only the valid transition vectors are fed into data channel control circuitry. This procedure substantially reduces the amount of data that must be loaded into the memory, and hence reduces the total time necessary to thoroughly test a circuit.

13 Claims, 4 Drawing Figures

DIGITAL TESTER LOCAL MEMORY DATA STORAGE SYSTEM

BACKGROUND OF THE INVENTION

The present invention relates to the control of data channel information in a device for the automatic in-circuit and/or functional digital testing of electronic components, and more particularly to a method for storing control data in a local memory of a data channel to substantially reduce the time required to load the data.

In a digital tester such as an in-circuit/functional electronic component tester of the type shown in U.S. Pat. No. 3,870,953 to Boatman et al, stimulus signals are applied to various accessable nodes on a printed circuit board and the response of individual components or groups of components on the board are measured at other nodes. The nature of the stimulus signals is such that they do not harm other components on the printed circuit board but they drive the node of the circuit under test sufficiently to overcome the influence of other components that might be connected to that node. In other digital testers for testing electronic components that are not connected to other circuits, e.g., individual IC's, or for functionally testing entire circuit boards through edge connectors, stimulus signals are similarly applied and responses are similarly measured, but the problems of harming other components and overcoming other signal levels are not present.

These various types of digital testers while differing significantly in the foregoing respects, do share a common problem with respect to time constraints, a problem addressed by the present invention. In particular, the time necessary to test an IC or a printed circuit board or each individual IC on a printed circuit board is a function of the speed with which the IC or board can be fully stimulated and measured for proper response to each stimulus. This problem may be understood more clearly through a discussion of a typical computer controlled in-circuit component tester of the type shown in the referenced Boatman et al patent.

In a computer controlled in-circuit tester, the stimulus signals are generated by a central control computer and applied to the nodes on the board through appropriate control and switching circuitry. The response of the tested electronic components to the stimulus signals can be fed directly to the control computer for evaluation, or can be received and processed by intermediate circuitry, and the results of the processing fed to the computer for final evaluation.

In some of the earliest versions of automatic test equipment of this type, the stimulus data generated by the computer was fed directly from the computer to the circuit nodes of the component being tested. However, the rate at which data can be transferred from the computer to the circuit under test (e.g., 1 MHz) is limited by the constraints of the software used in the computer. Consequently, the time necessary to thoroughly exercise a circuit, and particularly to test all components by in-circuit techniques, becomes excessively long as the length of test programs increase due to the advancing state of microelectronics and complexity of individual integrated circuit chips.

In order to reduce the time necessary to exercise a component or group of components in a circuit under test, automatic in-circuit test equipment has been provided with a local memory for each data channel in the tester as had previously been done in functional board testers and component testers. A typical data channel usually includes a driver/detector pair and a stimulus/response register in addition to the local memory. To conduct a test, the local memory is loaded with the stimulus vectors or test pattern and the expected response signals generated by the computer. Thereafter, the stored vectors are applied to the circuit under test through the data channels at a rate much faster than the rate at which they are originally read from the computer (e.g. 10-20 MHz). The ability to apply the test vectors to the circuit under test at this faster rate, coupled with the fact that various data channels can be operated simultaneously rather than sequentially by virtue of their local memory, substantially increases the speed with which a circuit can be thoroughly tested. A recent example of an in-circuit tester that incorporates local memory for each data channel is disclosed in U.S. Pat. No. 4,216,539.

With the increasing development and popularity of large scale integrated (LSI) and very large scale integrated (VLSI) circuit chips, the number of circuits and the complexity of functions performed within an individual chip require complex testing programs that play an important role in the rate at which circuits incorporating such chips can be thoroughly exercised. In a production environment in which thousands of circuit boards each containing a number of individual circuits must be tested daily, the throughput capabilities of the tester, i.e., the time required to thoroughly test an individual circuit board, becomes a very important practical consideration. Consequently, it becomes desirable to increase the throughput rate of automatic testers even further.

In an article entitled "Functional and In-Circuit Testing Team Up To Tackle VLSI In the '80s" by Peter Hansen, appearing in *Electronics* Magazine, Apr. 21, 1981, pp. 189-195, the author notes that the effective test rate of a system is the sum of the time to load data in a local channel memory, the time during which the data is transferred between the test system and the circuit board under test, and the measurement time in which results are compared. As discussed previously, the use of a local memory for each data channel may substantially reduce the time required to exchange information between the test system and the circuit under test, so that for all practical purposes this time period is not a significant factor in computing the overall test rate.

If the software of the central control computer is used to analyze the response of the circuit under test to the applied stimulus signals, the measurement time in the test procedure can be excessive. However, as disclosed in the Hansen article, if the hardware associated with each of the individual channels is configured so that it is capable of analyzing the responses from the tested circuit as well as apply the stimulus signals, e.g., if each data channel includes a comparator all of the responses in each of the channels can be analyzed simultaneously, thereby reducing the measurement time to the point where it also is not a significant factor in the overall test rate.

Consequently, the time required to load test vectors from the central control computer to the local memories of the individual data channels is a significant factor in determining the speed capabilities of the test system, and represents the next area to be addressed in decreasing total throughput time. The reason that the loading time is excessively long in comparison with the other steps of the test procedure is the fact that in presently available systems, all of the memory points in the local memory must be addressed at the time the information is being fed from the central control computer to the memory. In a typical in-circuit tester, each local memory might have a depth of 1000 bits of information. If the tester contains 128 data channels multiplexed to accommodate 256 test pins, for example, it will be appreciated that the time to load the test vectors from the computer into the memories can be considerable. For example, in one type of tester, information relating to transitions that occur in the channel data is stored on a disk in the central control computer system. Information relating to two data transitions stored on the disk might represent 10 test vectors to be applied during a test wherein the first 5 vectors are the same signal and the last 5 vectors each comprise the same signal, for example. Thus, each piece of transition data stored on the disk must be appropriately expanded into the appropriate number of corresponding test vectors before they can be loaded into the local memory. The time necessary to perform the expansion operation and thereafter load the test vectors into all of the memory points renders the total loading time prohibitively long.

Accordingly, it is a general object of the present invention to decrease the amount of time necessary to load test vector information from a central control computer into the local memories for data channels in an automatic digital tester.

It is another object of the present invention to achieve this general objective by reducing the amount of information that is required to be loaded into the memory.

It is a further object of the present invention to provide a novel method and apparatus for controlling the flow of information from a local memory in a data channel such that each storage location in a local memory need not store data that is significant to the test procedure.

It is a particular object of the present invention to provide a novel local memory system for a digital tester that requires only the storage of channel vector transition information and control data relating to the validity of stored data to thereby significantly reduce the effective test rate of the tester.

The manner in which the present invention achieves these, as well as other, objects and advantages will be more fully explained with reference to particular examples of the prior art and implementations of the invention illustrated in the accompanying drawings and described in the following detailed description.

DETAILED DESCRIPTION

Figure 1:
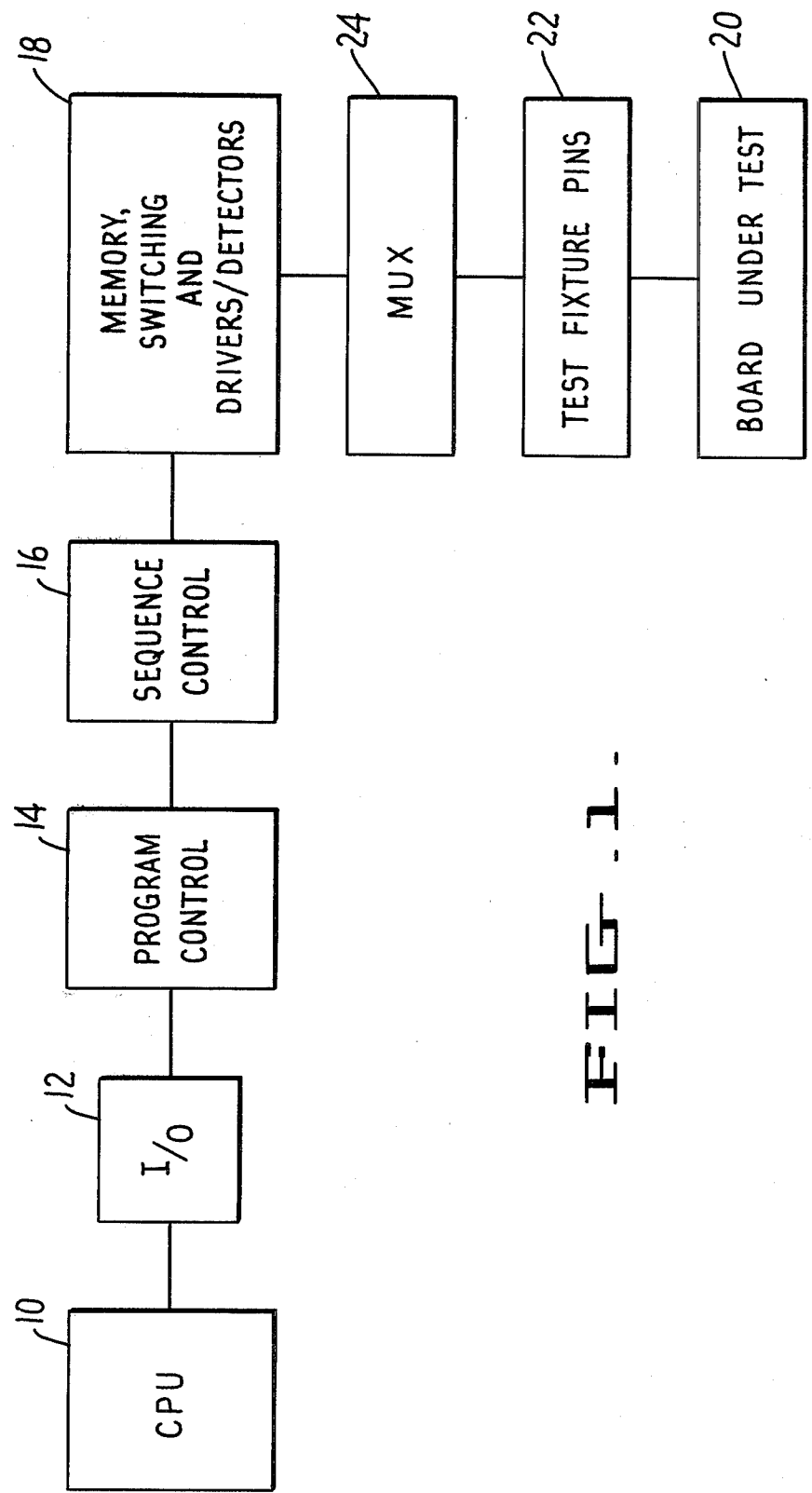
FIG. 1 is a block circuit diagram of the general components of an automatic digital testing apparatus having local memory architecture.

A block diagram of a digital tester of the type in which the present invention can be incorporated is illustrated in FIG. 1. The tester includes a control computer, or central processing unit, 10 that generally controls the operation of the tester and performs functions such as generating test vectors to be applied to the components to be tested, evaluating the responses of the components to the applied signals, and controlling the overall sequence and timing of the test signals. An input/output interface circuit 12 connects the control computer 10 with a program control circuit 14 and a sequence control circuit 16. The program control circuit 14 receives data from the central control computer 10 and routes it to appropriate memory units in the sequence control circuit 16 and a switching circuit 18. The program control circuit 14 can perform such other operations as running the switching circuit at a relatively slow speed when the sequence control circuit 16 is not operating, and carrying out a diagnostic function by reading strategic registers in the sequence control and switching circuits. The sequence control circuit 16 controls the operation of the switching circuit 18 by generating appropriate control and address signals at the proper times.

The switching circuit 18 includes a local memory, a set of control switches for selecting test pins, threshold levels, etc., and a driver/detector pair for each data channel in the test unit. Information is exchanged between the switching circuit 18 and a circuit board 20 under test by means of test fixture pins 22 that connect the data channels with nodes on the circuit board. The test pins 22 can be, for example, a bed of nails type assembly that comprises an array of spring loaded pins that contact the nodes on the board 20. Where the number of pins on the assembly 22 is greater than the number of data channels in the switching circuit 18, the data channels can be selectively connected to various ones of the pins through a suitable multiplexing unit 24.

In operation, the local memories within the switching circuit 18 are loaded with test vectors to be applied to the various nodes on the board during a test. These test vectors are generated within the control computer 10. After the memories are loaded, the necessary data channels are selectively enabled by means of control switches in the switching circuit 18. Stimulus signals are applied to the circuit board 20 by means of the selected data channels in the circuit 18. The responses of the components on the board to the applied stimulus signals are compared with expected results to determine whether the components are operating properly. This comparison is performed within the switching circuit 18 using the detectors of the selected data channels.

Figure 2:
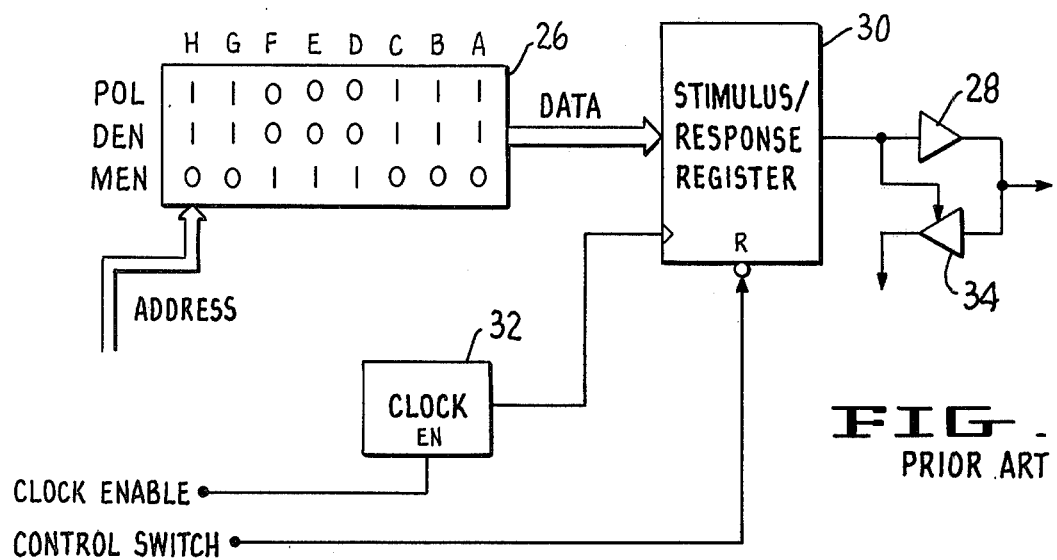
FIG. 2 is a block circuit diagram of a prior art local memory and data channel control circuit.

An example of a prior art local memory unit and a portion of its associated data channel is illustrated in block diagram form in FIG. 2. The local memory unit 26 is illustrated as having eight address locations labeled A–H, each of which contain 3 bits of vector information relating to the particular function to be performed by the data channel during a cycle of the test procedure. One of these 3 bits of information is a polarity (POL) bit that determines the binary state of a driver 28 in the data channel, or the expected state of a response from the measured circuit, depending on whether the data channel is used as a stimulus or response channel, respectively. A second bit is a drive enable (DEN) bit that controls the on/off state of the driver 28. The third bit is a match enable (MEN) bit that determines whether the measured output of the circuit under test is to be ignored or compared with the binary state indicated by the polarity bit.

In operation, an address location of the local memory 26 is addressed during each successive cycle of the test, respectively. The address signals that are applied to the memory 26 can be generated, for example, in the sequence control circuit 16. The address signals that are applied during two successive cycles can be the same or different. However, for each cycle, the vector information contained in the addressed location of the memory 26 is fed to a stimulus/response register 30, which receives the addressed information whenever it is provided with a clock pulse from a clock circuit 32. The clock circuit 32 is enabled to apply clock pulses to the register 30 by an enable signal supplied, for example, by the sequence control circuit 16. In response to the 3 bits of vector information supplied from the addressed location of the memory 26, the stimulus/response register 30 controls the operation of the driver 28 and a detector 34 to apply a stimulus signal, or measure the response, at a node to which the data channel is connected through a test pin on the assembly 22. One example of the manner in which the 3 bit vector word from the memory can be used to control the function of the data channel is described in greater detail in the aforementioned Hansen article, the disclosure of which is hereby incorporated by reference.

In the specific example illustrated in FIG. 2, all eight addresses are cycled sequentially. Therefore, the same 3-bit test vector is applied to the register 30 during the first three cycles of the test. On the fourth cycle, a transition is made in the information applied to the register, and this information remains the same for the next two cycles. Thereafter, another transition takes place in the information supplied to the register. Since an address location in the memory 26 is addressed during each cycle of the test, all of the information stored in the memory is eventually received by the register 30 in response to the enabling clock pulses. Consequently, it is necessary to write a valid bit of information into each point in the memory at the time the memory is loaded so that the register 30 will operate properly on each clock pulse. As discussed previously, the time required to load this information into the memory becomes significant in terms of determining the overall throughput rate of the tester.

Figure 3:
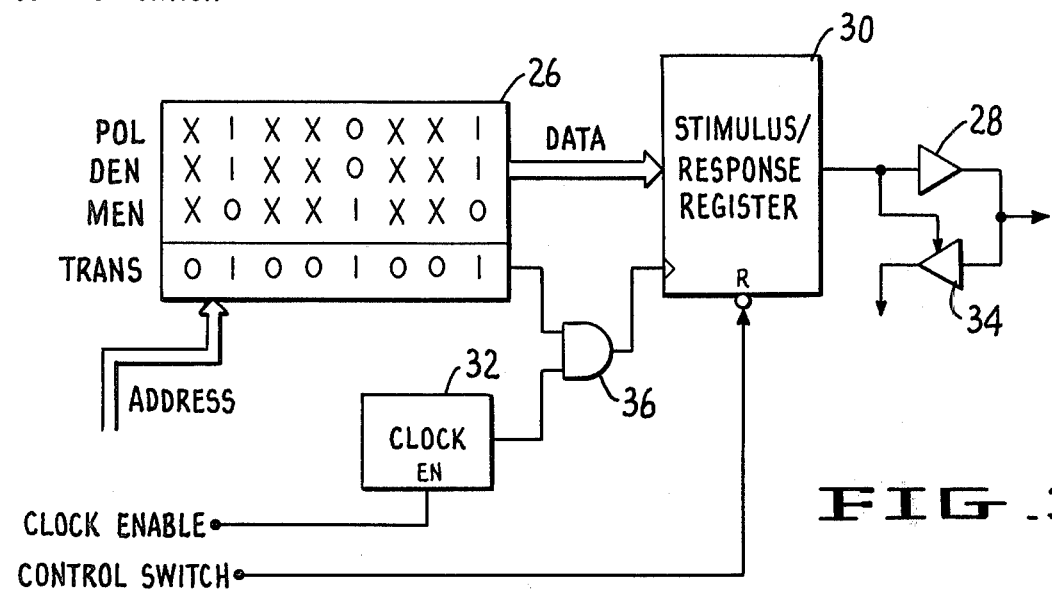
FIG. 3 is a block circuit diagram of one embodiment of a local memory and data channel control circuit implementing the present invention.

In accordance with the present invention, the amount of data that must be loaded into the local memory 26 for each channel can be reduced by loading into the memory only the information that indicates transitions to be undertaken in the operation of the data channel, along with an appropriate control bit to indicate whether a particular address location in the memory contains valid transition information. A circuit that implements this concept of the invention is illustrated in block diagram form in FIG. 3

In addition to the 3 bits of vector information, each memory location in the local memory 26 includes a fourth bit that identifies whether the 3 bits of vector information stored in that address location represent valid transition data for the operation of the data channel. Thus, utilizing the same example that is illustrated in FIG. 2, the transition bits (TRANS) in the address locations labeled A,D and G of the memory 26 indicate that the test vectors stored in those locations represent transitions in the operation of the data channel, whereas the transition bits in the other memory locations signify that those locations contain data that can be ignored, since such data does not represent a valid transition from the data stored in a previous location.

In operation, the transition bit controls the feeding of information from the local memory 26 into the stimulus/response register 30. In the embodiment illustrated in FIG. 3, the control bit is fed to one input terminal of an AND gate 36 which receives the clock signal from the clock 32 at its other input terminal. As each successive address location in the memory 26 is addressed during the test procedure, a clock pulse from the clock 32 will be presented to the register 30 by the gate 36 whenever the transition bit at the addressed location indicates that valid transition information is stored in that location. If the transition bit indicates otherwise for a memory location, however, the clock pulses will be blocked by the gate 36, and no information will pass from the memory 26 to the register 30 during the time that the particular memory location is addressed.

It will be appreciated that with the use of a control bit to gate the feeding of data from the memory 26 to the register 30 in this manner, it is not necessary to write vector information into the memory 26 at every memory location for each test procedure. Specifically, at the beginning of a test procedure, all of the stored transition bits can be cleared from the memory in parallel by performing a number of memory write cycles equal to the depth of the memory unit. Thereafter, it is only necessary to load vector information into those address locations relating to cycles in the test procedure in which transitions occur in the operation of the data channel, setting the transition bits at these locations. At all of the other memory locations, the transition bits that were reset during the clearing operation will inhibit any vector information stored therein from affecting the test procedure.

In the illustrated example, each of the first two test vectors is repeated for two cycles before a transition occurs. However, in a practical embodiment of a tester incorporating the present invention, the same test vector might be applied to the stimulus/response register for 5 or more consecutive test cycles before a transition occurs. Consequently, it will be appreciated that the need to load the memory only at those address locations in which transitions occur, rather than all locations, can result in a substantial savings in terms of memory loading time, and hence overall throughput rate.

Figure 4:
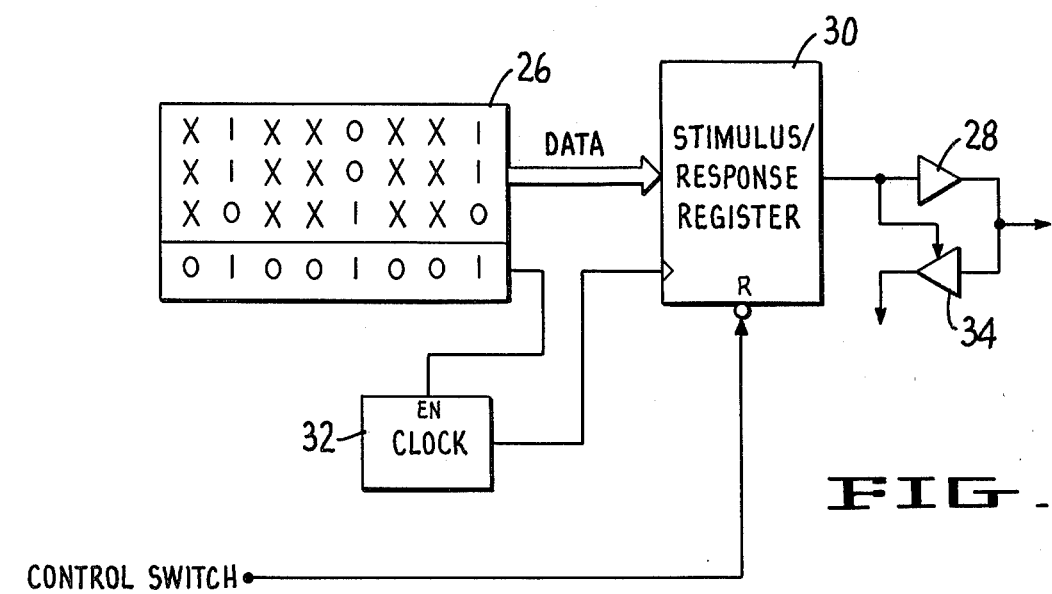
FIG. 4 is a block circuit diagram of a second embodiment of an implementation of the present invention

An alternative embodiment of a data channel circuit that implements the principles of the present invention is illustrated in FIG. 4. In this embodiment, the transition bit stored in the local memory 26 is fed to the enable input terminal of the clock 32. Thus, instead of controlling the gating of clock pulses after they have been generated by the clock, the transition bit controls the operation of the clock to enable or inhibit the generation of such pulses. In all other respects, the operation of the embodiment illustrated in FIG. 4 is the same as that of FIG. 3.

The present invention may be embodied in other specific forms without departing from the spirit or essential characteristics thereof. For example, depending on the manner in which data flows in the test equipment, it may be useful to provide a latching circuit for the transition bit stored in the local memory in order to ensure that the enable or gating signal provided by the bit is present at the correct time to properly control feeding of transition information from the memory to the data control circuit. The presently disclosed embodiments are therefore considered in all respects as illustrative and not restrictive. The scope of the invention is indicated by the appended claims rather than the foregoing description, and all changes which come within the meaning and range of equivalency of the claims are therefore intended to be embraced therein.

What is claimed is:

1. In a digital tester for testing electronic components, having a data channel that is operatively connected to the electronic component including an associated local memory having at least as many address locations as there are cycles in a testing procedure with a different location being addressed during each cycle in a testing procedure, a method of loading the local memory with digital information relating to the operation to be performed in the data channel during a test, comprising the steps of:

loading vectors describing transitions to be made in the operation to be performed in the data channel only at the address locations of the local memory that correspond to the test cycles in which said transitions are to take place; and loading into each address location of the local memory data that is indicative of whether the vector information stored in the address location is valid transition data.

2. The method of claim 1 wherein said data is a single bit.

3. In a digital tester for testing electronic components, a method of controlling the operation of a data channel during a testing procedure, comprising the steps of:

storing vectors describing transitions to be made in the operation to be performed in the data channel only in those address locations of a local memory that correspond to the cycles of the testing procedure in which said transitions are to take place;

storing in each address location of the local memory a control bit indicative of whether the information contained in that address location is a valid transition vector;

addressing a location in the local memory during each cycle of the testing procedure;

feeding the information stored in the addressed location of the local memory to a data channel control circuit; and enabling the data channel control circuit to receive the information only from those address locations in which the stored control bit indicates that a valid transition vector is stored.

4. The method of claim 3 wherein said data channel control circuit includes a register and said control bit controls a clock signal to said register so that the register is triggered by the clock signal to receive information from the local memory only when the control bit indicates a memory location containing a valid transition vector is presently being addressed.

5. A method of controlling the operation performed in a data channel in a system for testing electrical circuits, comprising the steps of:

storing test vectors describing transitions to be made in the operation to be performed in the data channel during the testing procedure;

storing a series of control bits for the testing procedure, said control bits being indicative of whether a transition of the operation of the data channel is to take place during a particular cycle of the testing procedure;

reading one of the stored control bits during each cycle of the test procedure; and feeding a stored test vector to a data channel control circuit only during those test cycles in which the control bit indicates that a transition is to take place.

6. A circuit for controlling the operation of a data channel in a digital test device, comprising:

a memory having a storage location for each cycle in a test procedure, said memory containing test vectors describing transitions to be made in the operation to be performed in the data channel at the storage locations corresponding to the test cycles in which the transitions are to take place, and a control bit in each storage location indicative of whether the storage location contains a valid transition vector;

a data channel control circuit for controlling the operation of the data channel in accordance with the vector information stored in the memory;

means for addressing a storage location during each successive cycle of a test procedure; and means responsive to the control bit stored in an addressed storage location for selectively enabling the data channel control circuit to receive the vector information in the addressed storage location.

7. The circuit of claim 6 wherein said data channel control circuit includes a register, and said selective enabling means includes means for controlling a clock signal that enables said register to read the information stored in said memory.

8. The circuit of claim 7 wherein said selective enabling means comprises a gate for gating the clock signal to said register in response to the control bit.

9. The circuit of claim 7 wherein the control bit is applied as an enable signal to a clock circuit for generating the clock signal.

10. In a digital tester for testing electronic components, a method of controlling the operation of a data channel during a testing procedure, comprising the steps of:

storing vectors describing transitions to be made in the operation to be performed in the data channel in a local memory;

storing in each address location of the local memory a control bit indicative of whether the information stored in that address location is a valid transition vector;

addressing a location in the local memory during each cycle of the testing procedure;

accessing the information stored in the addressed location of the local memory; and inhibiting a data channel control circuit from receiving the accessed information unless the control bit stored in the addressed location indicates that a valid transition vector is stored therein.

11. A method of storing data in the local memory of a data channel for a digital circuit tester, and controlling the testing operation performed in the data channel in accordance with the stored data, comprising the steps of:

clearing information relating to a previous testing operation from the local memory in parallel;

writing vector information into only those address locations of the local memory that relate to cycles in a testing procedure in which transitions occur in the operation of the data channel;

writing an enable control bit into those address locations of the local memory that contain valid transition data;

addressing a location in the local memory during each cycle of the testing procedure; and enabling a data channel control circuit to receive stored vector information only from those address locations in which a stored enable control bit indicates that valid transition data is stored.

12. The method of claim 11 wherein said data channel control circuit includes a register and said control bit controls a clock signal to said register so that the register is triggered by the clock signal to receive information from the local memory only when the control bit indicates a memory location containing a valid transition vector is presently being addressed.

13. The method of claim 11 wherein the step of clearing information in parallel includes performing a number of memory write cycles equal to the depth of the local memory.

* * * * *